(12) United States Patent
Ohno et al.

(10) Patent No.: US 10,504,718 B2
(45) Date of Patent: Dec. 10, 2019

(54) SUBSTRATE PROCESSING APPARATUS, SUBSTRATE PROCESSING METHOD, AND STORAGE MEDIUM

(71) Applicant: Tokyo Electron Limited, Tokyo (JP)

(72) Inventors: Hiroki Ohno, Kumamoto (JP); Keisuke Egashira, Kumamoto (JP); Gentaro Goshi, Kumamoto (JP); Yosuke Kawabuchi, Kumamoto (JP); Shotaro Kitayama, Kumamoto (JP); Hiroshi Marumoto, Kumamoto (JP); Takuro Masuzumi, Kumamoto (JP); Kento Tsukano, Kumamoto (JP); Hiromi Kiyose, Kumamoto (JP)

(73) Assignee: Tokyo Electron Limited, Tokyo (JP)

(*) Notice: Subject to any disclaimer, the term of this patent is extended or adjusted under 35 U.S.C. 154(b) by 98 days.

(21) Appl. No.: 15/814,592

(22) Filed: Nov. 16, 2017

(65) Prior Publication Data
US 2018/0138035 A1     May 17, 2018

(30) Foreign Application Priority Data
Nov. 17, 2016   (JP) .................................. 2016-224419

(51) Int. Cl.
*H01L 21/02*     (2006.01)
*H01L 21/67*     (2006.01)

(52) U.S. Cl.
CPC .. *H01L 21/02101* (2013.01); *H01L 21/02057* (2013.01); *H01L 21/6719* (2013.01); *H01L 21/67034* (2013.01); *H01L 21/67051* (2013.01)

(58) Field of Classification Search
CPC .......... H01L 21/02101; H01L 21/02057; H01L 21/67034; H01L 21/67051; H01L 21/6719
USPC .............................................. 34/357
See application file for complete search history.

(56) References Cited

U.S. PATENT DOCUMENTS

| 4,682,564 A  * | 7/1987  | Cann    | H05H 1/54     |
|                |         |         | 118/50.1      |
| RE34,806 E  *  | 12/1994 | Cann    | C23C 16/513   |
|                |         |         | 118/723 DC    |
| 8,393,091 B2 * | 3/2013  | Kawamoto | H01L 21/02057 |
|                |         |         | 134/21        |
| 8,701,308 B2 * | 4/2014  | Hiroshiro | H05B 3/0052 |
|                |         |         | 118/723 E     |

(Continued)

FOREIGN PATENT DOCUMENTS

JP      2013-012538 A      1/2013

*Primary Examiner* — Stephen M Gravini
(74) *Attorney, Agent, or Firm* — Abelman, Frayne & Schwab

(57) ABSTRACT

During at least part of a time period for a pressure increasing step of increasing a pressure inside a processing container from a pressure lower than a critical pressure of a processing fluid to a pressure higher than the critical pressure, pressure increasing is performed by supplying the processing fluid into the processing container from a fluid supply source while discharging the processing fluid from the processing container at a controlled discharge flow rate. Particles attached to the surfaces of members inside the processing container travel upward by the supply of the processing fluid into the processing container from the fluid supply source. The particles are discharged along with the processing fluid from the processing container.

10 Claims, 6 Drawing Sheets

(56) References Cited

U.S. PATENT DOCUMENTS

| | | | | |
|---|---|---|---|---|
| 8,793,898 | B2* | 8/2014 | Jeong | H01L 21/02057 |
| | | | | 34/351 |
| 9,275,847 | B2* | 3/2016 | Jung | H01L 21/00 |
| 9,506,695 | B2* | 11/2016 | Kim | F26B 21/003 |
| 9,978,584 | B2* | 5/2018 | Lee | B08B 7/0021 |
| 10,109,506 | B2* | 10/2018 | Kim | H01L 21/67017 |
| 10,197,333 | B2* | 2/2019 | Kim | F26B 21/145 |
| 2002/0170577 | A1* | 11/2002 | Mizobata | B08B 7/0021 |
| | | | | 134/30 |
| 2006/0185693 | A1* | 8/2006 | Brown | B08B 7/0021 |
| | | | | 134/26 |
| 2007/0293054 | A1* | 12/2007 | Lee | H01L 21/02101 |
| | | | | 438/743 |
| 2018/0012755 | A1* | 1/2018 | Lee | B08B 7/0021 |
| 2018/0138035 | A1* | 5/2018 | Ohno | H01L 21/02057 |
| 2018/0211823 | A1* | 7/2018 | Severin | C23C 14/0063 |
| 2018/0323063 | A1* | 11/2018 | Delmas | H01L 21/02101 |

* cited by examiner

SUBSTRATE PROCESSING APPARATUS, SUBSTRATE PROCESSING METHOD, AND STORAGE MEDIUM

CROSS-REFERENCE TO RELATED APPLICATIONS

This application is based on and claims priority from Japanese Patent Application No. 2016-224419, filed on Nov. 17, 2016, with the Japan Patent Office, the disclosure of which is incorporated herein in its entirety by reference.

TECHNICAL FIELD

The present disclosure relates to a technology of removing a liquid remaining on the surface of a substrate by using a processing fluid in a supercritical state.

BACKGROUND

In a semiconductor device manufacturing process in which a laminated structure of an integrated circuit is formed on the surface of, for example, a semiconductor wafer (hereinafter, referred to as a "wafer") as a substrate, a liquid processing such as, for example, chemical liquid cleaning or wet etching is performed. When removing liquid remaining on the surface of the wafer using the liquid processing, a drying method using a processing fluid in a supercritical state has been recently used (see, e.g., Japanese Patent Laid-Open Publication No. 2013-012538).

When the drying processing of the substrate is performed by supplying the processing fluid in the supercritical state into a processing container from a supercritical fluid supply source, for example, the phenomenon that particles attached to the surfaces of members inside the processing container travel upward and are attached to the surface of the processed substrate frequently occurs.

SUMMARY

An exemplary embodiment of the present disclosure provides a substrate processing apparatus for processing a substrate using a processing fluid in a supercritical state, the apparatus including: a processing container that accommodates the substrate; a supply line that connects a fluid supply source configured to feed the processing fluid in the supercritical state and the processing container to each other; a discharge line that discharges the processing fluid from the processing container; a discharge flow rate regulation unit that regulates a flow rate of the processing fluid discharged from the processing container to the discharge line; and a controller that controls an operation of the discharge flow rate regulation unit, wherein during at least part of a time period for a pressure increasing step of increasing a pressure inside the processing container from a pressure lower than a critical pressure of the processing fluid to a pressure higher than the critical pressure, the controller controls the discharge flow rate regulation unit such that pressure increasing is performed by supplying the processing fluid into the processing container from the fluid supply source through the supply line while discharging the processing fluid from the processing container to the discharge line at a controlled discharge flow rate.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
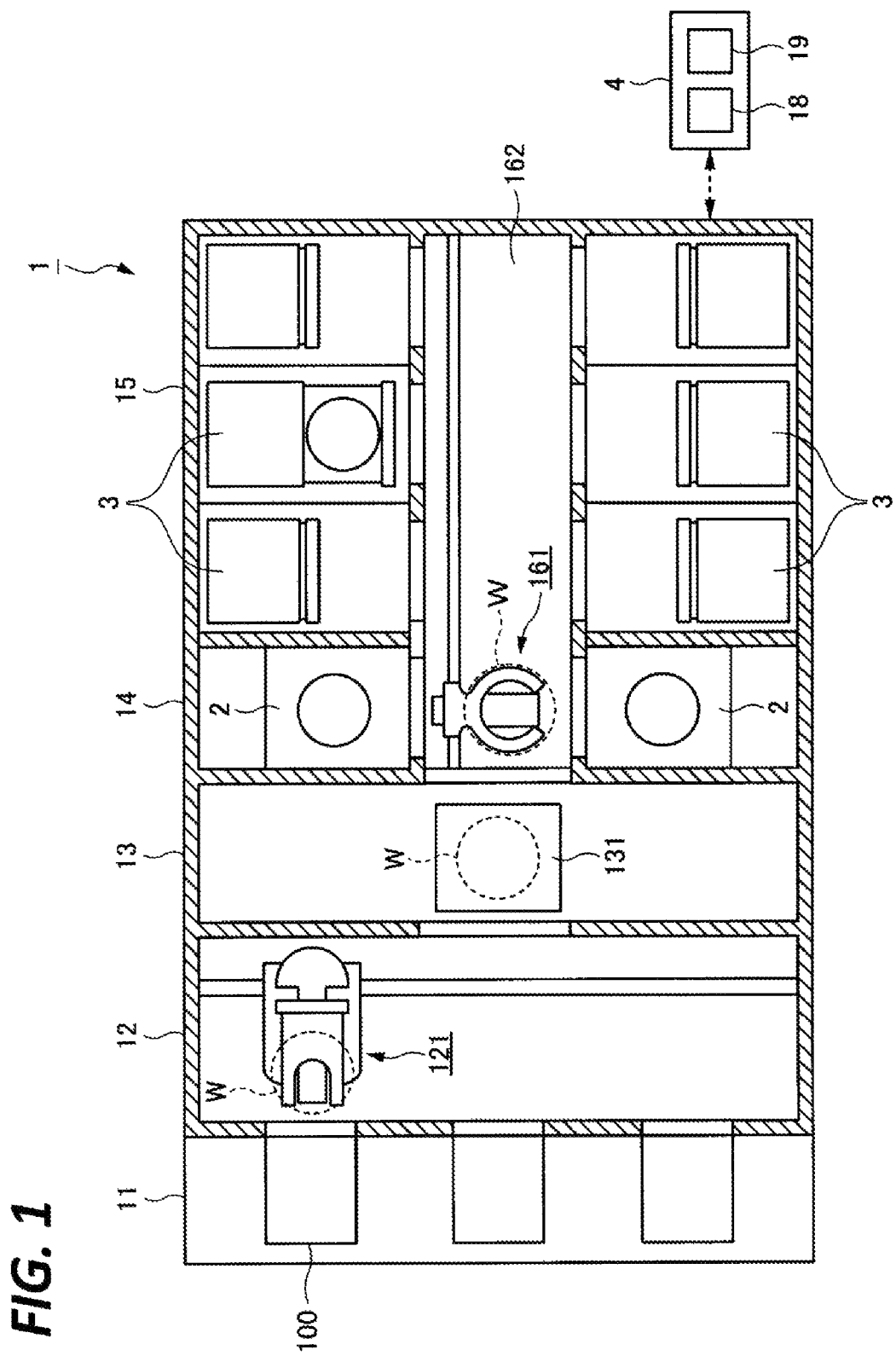
FIG. 1 is a horizontal sectional plan view illustrating the entire configuration of a substrate processing system.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

An object of the present disclosure is to provide a technology capable of reducing the level of particles attached to the surface of a processed substrate using a processing liquid in a supercritical state.

An exemplary embodiment of the present disclosure provides a substrate processing apparatus for processing a substrate using a processing fluid in a supercritical state, the apparatus including: a processing container that accommodates the substrate; a supply line that connects a fluid supply source configured to feed the processing fluid in the supercritical state and the processing container to each other; a discharge line that discharges the processing fluid from the processing container; a discharge flow rate regulation unit that regulates a flow rate of the processing fluid discharged from the processing container to the discharge line; and a controller that controls an operation of the discharge flow rate regulation unit, wherein during at least part of a time period for a pressure increasing step of increasing a pressure inside the processing container from a pressure lower than a critical pressure of the processing fluid to a pressure higher than the critical pressure, the controller controls the discharge flow rate regulation unit such that pressure increasing is performed by supplying the processing fluid into the processing container from the fluid supply source through the supply line while discharging the processing fluid from the processing container to the discharge line at a controlled discharge flow rate.

In the above-described substrate processing apparatus, during an entire time period for the pressure increasing step, the controller controls the discharge flow rate regulation unit such that pressure increasing is performed by supplying the processing fluid into the processing container from the fluid supply source through the supply line while discharging the processing fluid from the processing container to the discharge line at a controlled discharge flow rate.

In the above-described substrate processing apparatus, the controller changes the discharge flow rate to be different in a first time period of the pressure increasing step and in a second time period of the pressure increasing step after the first time period.

In the above-described substrate processing apparatus, the discharge flow rate in the first time period is larger than the discharge flow rate in the second time period.

Another exemplary embodiment of the present disclosure provides a substrate processing method for processing a substrate using a processing fluid in a supercritical state, the method including: a carry-in step of causing the substrate to be accommodated in a processing container; and a pressure increasing step of increasing a pressure inside the processing container from a pressure lower than a critical pressure of the processing fluid to a pressure higher than the critical pressure, wherein during at least part of a time period for the pressure increasing step, pressure increasing is performed by supplying the processing fluid into the processing container from a fluid supply source while discharging the processing fluid from the processing container at a controlled discharge flow rate.

In the above-described substrate processing method, during an entire time period for the pressure increasing step, pressure increasing is performed by supplying the processing fluid into the processing container from a fluid supply source while discharging the processing fluid from the processing container at a controlled discharge flow rate.

In the above-described substrate processing method, the discharge flow rate is changed to be different in a first time period of the pressure increasing step and in a second time period of the pressure increasing step after the first time period.

In the above-described substrate processing method, the discharge flow rate in the first time period is larger than the discharge flow rate in the second time period.

Still another exemplary embodiment of the present disclosure provides a non-transitory computer-readable storage medium storing a program that, when executed by a computer that controls an operation of a substrate processing apparatus, causes the computer to control the operation of the substrate processing apparatus and execute the above-described substrate processing method.

According to the present disclosure, the level of particles attached to the surface of a processed substrate may be reduced using a processing fluid in a supercritical state.

Hereinafter, an exemplary embodiment of the present disclosure will be described with reference to the accompanying drawings. For convenience to facilitate the illustration and understanding, the configurations illustrated in the drawings may include portions of which, for example, sizes and scales are changed from those of actual sizes and scales.

[Configuration of Substrate Processing System]

As illustrated in FIG. 1, a substrate processing system 1 includes a plurality of cleaning apparatuses 2 (two cleaning apparatuses 2 in the example illustrated in FIG. 1) that perform a cleaning processing by supplying a cleaning liquid to wafers W, and a plurality of supercritical processing apparatuses 3 (six supercritical processing apparatuses 3 in the example illustrated in FIG. 1) that remove a drying prevention liquid (isopropyl alcohol (IPA) in the present exemplary embodiment) remaining on the cleaned wafers W by causing the drying prevention liquid to be in contact with a processing liquid in a supercritical state (carbon dioxide ($CO_2$) in the present exemplary embodiment).

In the substrate processing system 1, front opening unified pods (FOUPs) 100 are placed in a placement section 11, and a wafer W accommodated in each FOUP 100 is delivered to a cleaning processing section 14 and a supercritical processing section 15 via a carry in/out section 12 and a delivery section 13. In the cleaning processing section 14 and the supercritical processing section 15, first, the wafer W is carried into a cleaning apparatus 2 provided in the cleaning processing section 14 and subjected to a cleaning processing. Then, the wafer W is carried into a supercritical processing apparatus 3 provided in the supercritical processing section 15 and subjected to a drying processing for removing the IPA on the wafer W. In FIG. 1, the reference numeral "121" indicates a first conveyance mechanism that conveys the wafer W between the FOUP 100 and the delivery section 13, and the reference numeral "131" indicates a delivery shelf that serves as a buffer for temporarily placing thereon the wafer W to be conveyed between the carry in/out section 12 and the cleaning processing section 14 or the supercritical processing section 15.

A wafer conveyance path 162 is connected to an opening of the delivery section 13, and the cleaning processing section 14 and the supercritical processing section 15 are provided along the wafer conveyance path 162. In the cleaning processing section 14, total two cleaning apparatuses 2 are provided such that the wafer conveyance path 162 is interposed therebetween. Meanwhile, in the supercritical processing section 15, three supercritical processing apparatuses 3 are arranged at each of the opposite sides of the wafer conveyance path 162 such that total six supercritical processing apparatuses 3 are provided. Each supercritical processing apparatus 3 functions as a substrate processing apparatus that performs the drying processing for removing the IPA from the wafer W. A second conveyance mechanism 161 is provided in the wafer conveyance path 162 to be movable within the wafer conveyance path 162. The wafer W placed on the delivery shelf 131 is received by the second conveyance mechanism 161, and the second conveyance mechanism 161 carries the wafer W into the cleaning apparatus 2 and the supercritical processing apparatus 3. In addition, the number and the arrangement forms of the cleaning apparatuses 2 and the supercritical processing apparatuses 3 are not specifically limited, and an appropriate number of cleaning apparatuses 2 and supercritical processing apparatuses 3 are arranged in an appropriate form according to, for example, the number of wafers W to be processed per unit time and processing time of each of the cleaning apparatuses 2 and the supercritical processing apparatuses 3.

Each cleaning apparatus 2 is configured with a single wafer type apparatus that cleans wafers W one by one through, for example, spin cleaning. In this case, the cleaning processing of a wafer W may be performed by supplying a cleaning chemical liquid or a rinse liquid for washing off the chemical liquid to the processed surface of the wafer W at an appropriate timing while rotating the wafer W in a horizontally held state around a vertical axis. The chemical liquid and the rinse liquid used in the cleaning apparatus 2 are not specifically limited. For example, an SC1 liquid (i.e., a mixed solution of ammonia and hydrogen peroxide water) which is an alkaline chemical liquid may be supplied to the wafer W so as to remove particles or organic contaminants from the wafer W. Then, deionized water (DIW) which is a rinse liquid may be supplied to the wafer W so as to wash off the SC1 liquid from the wafer W. In addition, a dilute hydrofluoric acid (DHF) aqueous solution which is an acidic chemical liquid may be supplied to the wafer W so as to remove a natural oxide film, and then, DIW may be supplied to the wafer W so as to wash off the dilute hydrofluoric acid aqueous solution from the wafer W.

When the rinsing processing by the DIW is completed, the cleaning apparatus 2 supplies IPA as a drying prevention liquid to the wafer W while rotating the wafer W, so as to replace the DIW remaining on the processed surface of the wafer W with the IPA. Thereafter, the rotation of the wafer W is slowly stopped. At this time, since the IPA is supplied in a sufficient amount to the wafer W, the surface of the wafer W on which a pattern of a semiconductor is formed becomes a state of being filled with the IPA so that a liquid film of the IPA is formed on the surface of the wafer W. The wafer W is carried out from the cleaning apparatus 2 by the second conveyance mechanism 161 while being kept in the state of being filled with the IPA.

The IPA applied to the surface of the wafer W in this way has a function to prevent the drying of the wafer W. Especially, in order to suppress an occurrence of a so-called pattern collapse on the wafer W due to evaporation of the IPA during the conveyance of the wafer W from the cleaning apparatus 2 to the supercritical processing apparatus 3, the cleaning apparatus 2 applies the IPA in a sufficient amount to the wafer W such that an IPA film having a relatively thick thickness is formed on the surface of the wafer W.

The wafer W carried out from the cleaning apparatus 2 is carried into the processing container of the supercritical processing apparatus 3 by the second conveyance mechanism 161 in the state of being filled with the IPA, and the IPA drying processing is performed in the supercritical processing apparatus 3.

[Supercritical Processing Apparatus]

Hereinafter, the supercritical processing apparatus 3 will be described with reference to FIGS. 2 to 4.

Figure 2:
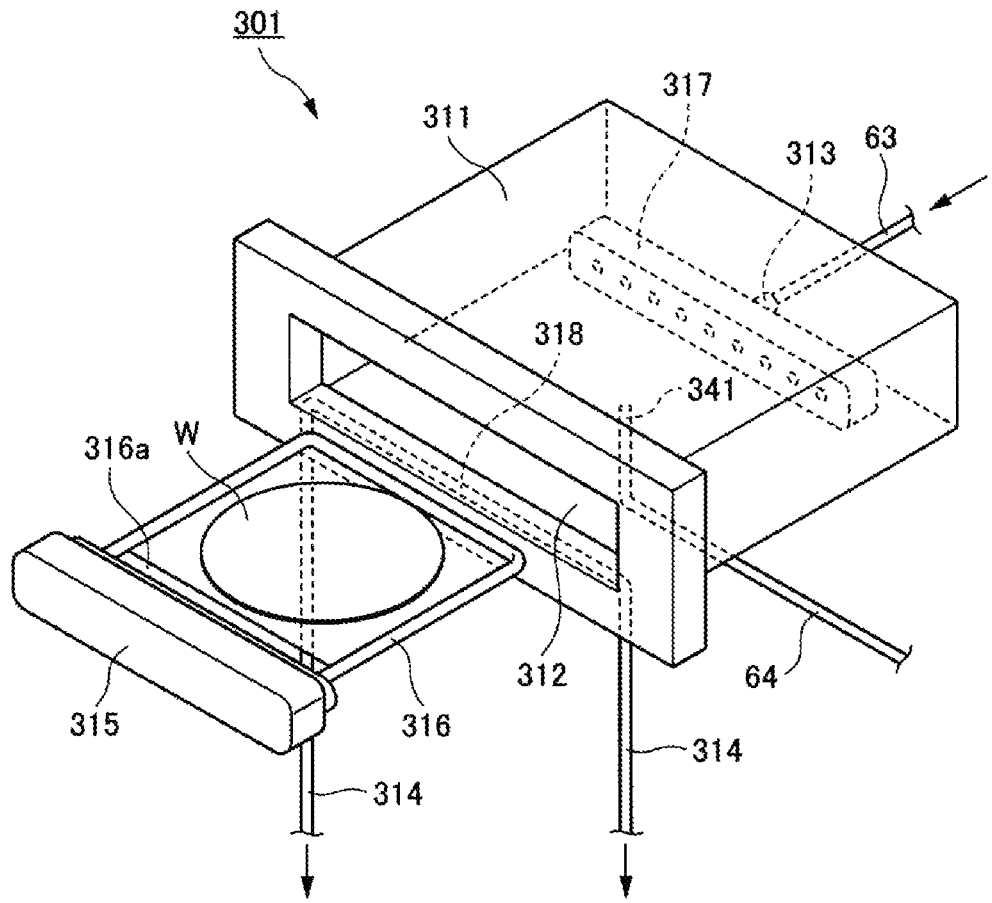
FIG. 2 is a perspective view illustrating the external appearance of a processing container of a supercritical processing apparatus.
Figure 3:
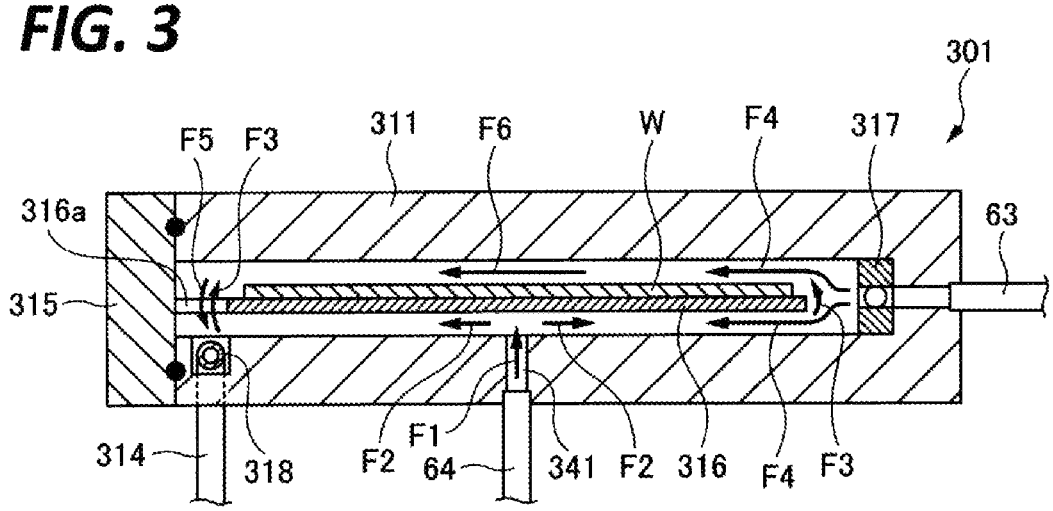
FIG. 3 is a sectional view of the processing container.

As illustrated in FIGS. 2 and 3, a processing container 301 includes a container body 311 having an opening 312 for carry in/out of a wafer W, a holding plate 316 that horizontally holds a wafer W to be processed, and a lid member 315 that supports the holding plate 316 and seals the opening 312 when the wafer W is carried into the container body 311.

The container body 311 is a container in which a processing space capable of accommodating a wafer W having a diameter of, for example, 300 mm is formed. A fluid supply header (a first fluid supply unit) 317 is provided on the side of one internal end of the container body 311, and a fluid discharge header (a fluid discharge unit) 318 is provided on the side of the other internal end thereof. In the illustrated example, the fluid supply header 317 is formed of a block body having a large number of openings (fluid supply ports), and the fluid discharge header 318 is formed of a pipe having a large number of openings (fluid discharge ports). The fluid supply ports of the fluid supply header 317 may be arranged at a position slightly higher than the upper surface of the wafer W held by the holding plate 316.

The configurations of the fluid supply header 317 and the fluid discharge header 318 are not limited to those in the illustrated example. For example, the fluid discharge header 318 may be formed of a block body, and the fluid supply header 317 may be formed of a pipe.

When the holding plate 316 is viewed from the bottom side, the holding plate 316 covers the substantially entire area of the lower surface of the wafer W. The holding plate 316 has an opening 316a at the end portion thereof on the side of the lid member 315. The processing fluid existing in the space above the holding plate 316 is guided to the fluid discharge header 318 through the opening 316a (see arrow F5 in FIG. 3).

The fluid supply header 317 supplies the processing fluid into the container body 311 (the processing container 301) in the substantially horizontal direction. Here, the horizontal direction refers to a direction perpendicular to the vertical direction in which the gravity acts, and generally refers to a direction parallel with the direction in which the flat surface of the wafer W held by the holding plate 316 extends.

The fluid inside the processing container 301 is discharged to the outside of the processing container 301 through the fluid discharge header 318. The fluid discharged through the fluid discharge header 318 contains not only the processing fluid supplied into the processing container 301 through the fluid supply header 317 but also the IPA remaining on the surface of the wafer W and dissolved in the processing fluid.

A fluid supply nozzle (a second fluid supply unit) 341 is provided at the bottom portion of the container body 311 to supply the processing fluid into the processing container 301. In the illustrated example, the fluid supply nozzle 341 is configured with an opening formed in the bottom wall of the container body 311. The fluid supply nozzle 341 is positioned below (e.g., directly below) the central portion of the wafer W, and supplies the processing fluid into the processing container 301 toward the central portion of the wafer W (e.g., toward the vertically upward side).

The processing container 301 further includes a pressing mechanism (not illustrated). The pressing mechanism has a function to press the lid member 315 toward the container body 311, against the internal pressure caused by the processing fluid in the supercritical state that is supplied into the processing space, so as to seal the processing space. In addition, for example, a heat insulating material or a tape heater (not illustrated) may be provided on the ceiling wall and the bottom wall of the container body 311, such that the processing fluid supplied into the processing space may maintain the temperature thereof in the supercritical state.

Figure 4:
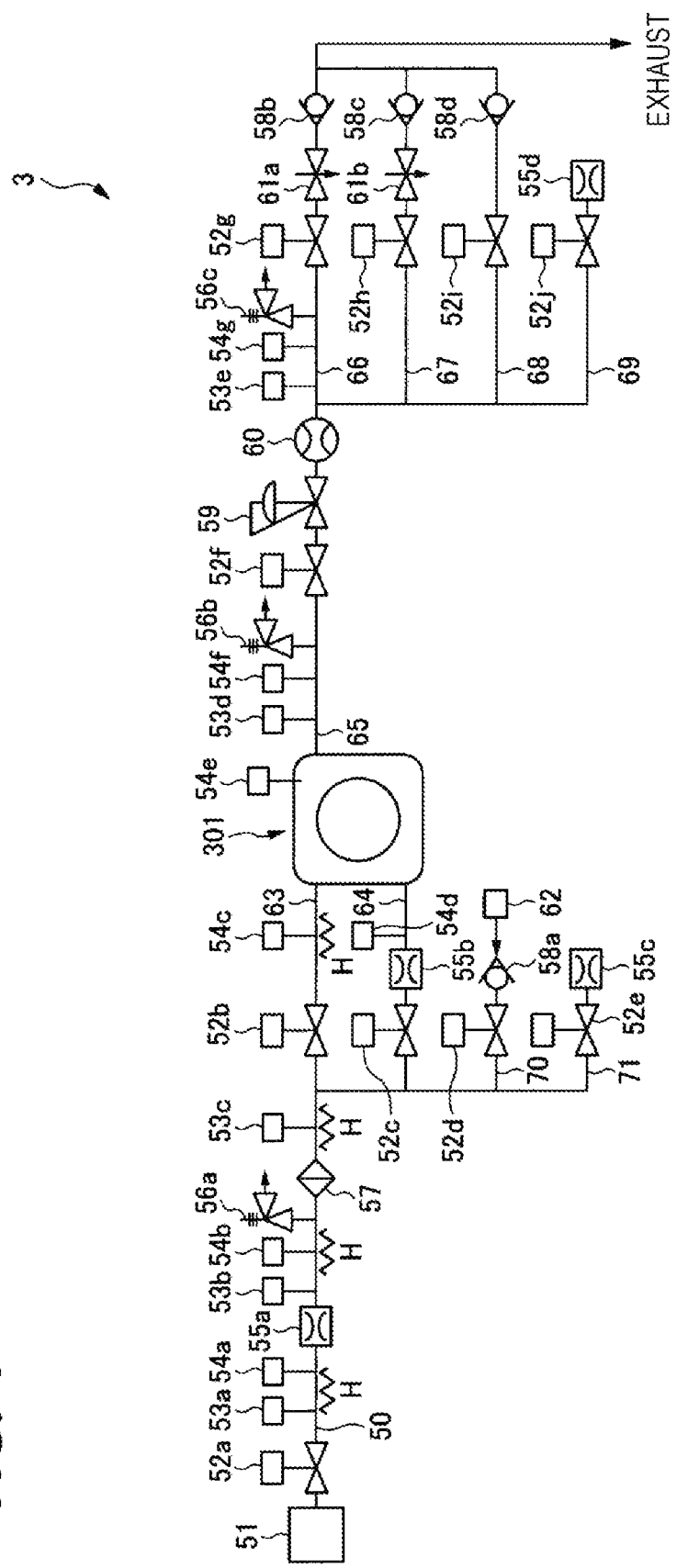
FIG. 4 is a piping system view of the supercritical processing apparatus.

As illustrated in FIG. 4, the supercritical processing apparatus 3 includes a fluid supply tank 51 which is a supply source of the processing fluid in the supercritical state, for example, a processing fluid having a high pressure of about 16 MPa (megapascals) to 20 MPa. A main supply line 50 is connected to the fluid supply tank 51. The main supply line 50 is branched in a middle portion thereof into a first supply line 63 that is connected to the fluid supply header (the first fluid supply unit) 317 inside the process container 301 and a second supply line 64 that is connected to the fluid supply nozzle (the second fluid supply unit) 341.

An opening/closing valve 52a, an orifice 55a, a filter 57, and an opening/closing valve 52b are provided in this order from the upstream side between the fluid supply tank 51 and the fluid supply header 317 (i.e., on the main supply line 50 and the first supply line 63 continuous to the main supply line 50). The second supply line 64 is branched from the main supply line 50 at a position between the filter 57 and the opening/closing valve 52b. An opening/closing valve 52c is provided on the second supply line 64.

The orifice 55a is provided to lower the flow rate of the processing fluid supplied from the fluid supply tank 51, in order to protect the wafer W. The filter 57 is provided to remove foreign substances (particle-causing substances) contained in the processing fluid flowing through the main supply line 50.

The supercritical processing apparatus 3 further includes a purge gas supply line 70 connected to a purge device 62 via an opening/closing valve 52d and a check valve 58a, and a discharge line 71 connected to the external space of the supercritical processing apparatus 3 via an opening/closing valve 52e and an orifice 55c. The purge gas supply line 70 and the discharge line 71 are connected to the main supply line 50, the first supply line 63, and the second supply line 64.

The purge gas supply line 70 is used to fill the processing container 301 with an inert gas and keep the processing container 301 in a clean state, for example, during the stop of the supply of the processing fluid from the fluid supply tank 51 into the processing container 301. The discharge line 71 is used to discharge the processing fluid remaining in the supply line between the opening/closing valves 52a and 52b to the outside, for example, at the time when the power of the supercritical processing apparatus 3 is turned off.

A main discharge line 65 is connected to the fluid discharge header 318 inside the processing container 301. The main discharge line 65 is branched in a middle portion thereof into a first discharge line 66, a second discharge line 67, a third discharge line 68, and a fourth discharge line 69.

An opening/closing valve 52f, a back pressure valve 59, a concentration sensor 60, and an opening/closing valve 52g are provided in this order from the upstream side on the main discharge line 65 and the first discharge line 66 continuous to the main discharge line 65.

The back pressure valve 59 is configured to be opened when a pressure of a primary side (equal to the pressure inside the processing container 301) exceeds a set pressure, to cause the fluid to flow toward a secondary side such that the pressure of the primary side is maintained at the set pressure. The set pressure of the back pressure valve 59 may be changed by a controller 4 at any time.

The concentration sensor 60 measures an IPA concentration of the fluid flowing through the main discharge line 65.

A needle valve (a variable throttle) 61a and a check valve 58b are provided on the downstream side of the first discharge line 66 from the opening/closing valve 52g. The needle valve 61a regulates the flow rate of the fluid discharged to the outside of the supercritical processing apparatus 3 through the first discharge line 66.

The second discharge line 67, the third discharge line 68, and the fourth discharge line 69 are branched from the main discharge line 65 at a position between the concentration sensor 60 and the opening/closing valve 52g. An opening/closing valve 52h, a needle valve 61b, and a check valve 58c are provided on the second discharge line 67. An opening/closing valve 52i and a check valve 58d are provided on the third discharge line 68. An opening/closing valve 52j and an orifice 55d are provided on the fourth discharge line 69.

The second discharge line 67 and the third discharge line 68 are connected to a first discharge destination, e.g., a fluid recovery apparatus, and the fourth discharge line 69 is connected to a second discharge destination, e.g., the atmospheric space outside the supercritical processing apparatus 3 or an exhaust system of a plant.

When the fluid is discharged from the processing container 301, one or more of the opening/closing valves 52g, 52h, 52i, and 52j are brought into an opened state. Especially, when the supercritical processing apparatus 3 is stopped, the opening/closing valve 52j may be opened to discharge the fluid existing in the first discharge line 66 between the concentration sensor 60 and the opening/closing valve 52g to the outside of the supercritical processing apparatus 3.

Pressure sensors and temperature sensors are provided at various positions on the lines of the supercritical processing apparatus 3 through which the fluid flows, to detect the pressure and the temperature of the fluid, respectively. In the example illustrated in FIG. 4, a pressure sensor 53a and a temperature sensor 54a are provided between the opening/closing valve 52a and the orifice 55a. A pressure sensor 53b and a temperature sensor 54b are provided between the orifice 55a and the filter 57. A pressure sensor 53c is provided between the filter 57 and the opening/closing valve 52b. A temperature sensor 54c is provided between the opening/closing valve 52b and the processing container 301. A temperature sensor 54d is provided between the orifice 55b and the processing container 301. Further, a pressure sensor 53d and a temperature sensor 54f are provided between the processing container 301 and the opening/closing valve 52f, and a pressure sensor 53e and a temperature sensor 54g are provided between the concentration sensor 60 and the opening/closing valve 52g. In addition, a temperature sensor 54e is provided to detect the temperature of the fluid inside the processing container 301.

Four heaters H are provided on the main supply line 50 and the first supply line 63 to regulate the temperature of the processing fluid supplied into the processing container 301. Heaters H may be further provided on the discharge lines on the downstream side from the processing container 301.

A safety valve (a relief valve) 56a is provided between the orifice 55a and the filter 57 of the main supply line 50. A safety valve 56b is provided between the processing container 301 and the opening/closing valve 52f. A safety valve 56c is provided between the concentration sensor 60 and the opening/closing valve 52g. The safety valves 56a to 56c urgently discharge the fluid in the lines (pipes) provided with the safety valves to the outside at the time of abnormality, for example, when the pressure inside the line excessively increases.

The controller 4 receives measurement signals from the various sensors illustrated in FIG. 3 (e.g., the pressure sensors 53a to 53e, the temperature sensors 54a to 54g, and the concentration sensor 60), and transmits control signals (e.g., opening/closing signals for the opening/closing valves 52a to 52j, a set pressure regulation signal for the back pressure valve 59, opening degree regulation signals for the needle valves 61a to 61b) to the various functional elements. The controller 4 is, for example, a computer and includes a calculation unit 18 and a storage unit 19. The storage unit 19 stores a program for controlling the various processings performed in the substrate processing system 1. The calculation unit 18 reads and executes the program stored in the storage unit 19 so as to control the operation of the substrate processing system 1. The program may be stored in a computer readable storage medium, and may be installed in the storage unit 19 of the controller 4 from the storage medium. The computer readable storage medium may be, for example, a hard disk (HD), a flexible disk (FD), a compact disk (CD), a magneto-optical disk (MO), or a memory card.

[Supercritical Drying Processing]

Next, an IPA drying mechanism using the processing fluid in the supercritical state (e.g., carbon dioxide ($CO_2$)) will be briefly described with reference to FIGS. 5A to 5D.

Immediately after a processing fluid R in a supercritical state is introduced into the processing container 301, the IPA alone exists within the concave portions of a pattern P of the wafer W.

Figure 5A:
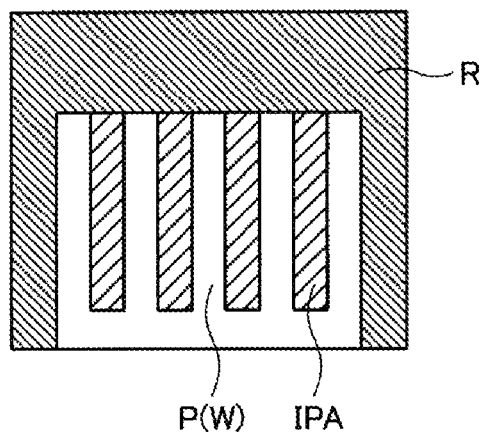
FIGS. 5A to 5D are views for explaining an IPA drying mechanism.
Figure 5B:
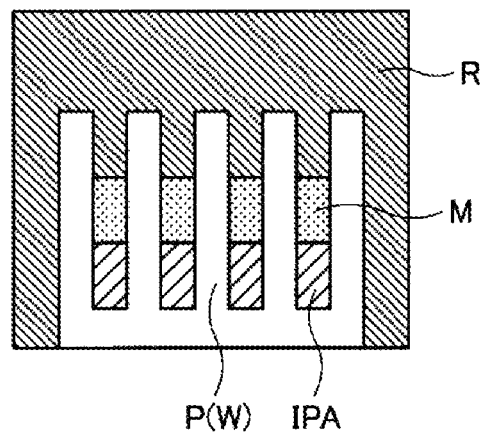

As the IPA within the concave portions come into contact with the processing fluid R in the supercritical state, the IPA is gradually dissolved in the processing fluid R and gradually replaced with the processing fluid R, as illustrated in FIG. 5B. At this time, in addition to the IPA and the processing fluid R, a mixed fluid M in a state where the IPA and the processing fluid R are mixed with each other exists in the concave portions.

Figure 5C:
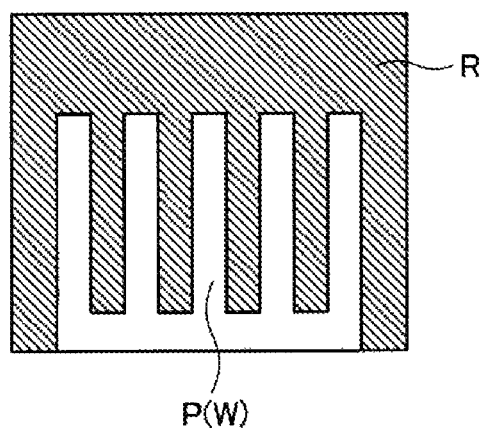

As the replacement of the IPA with the processing fluid R within the concave portions is progressed, the IPA existing within the concave portions is reduced, and only the processing fluid R in the supercritical state finally exists within the concave portions as illustrated in FIG. 5C.

Figure 5D:
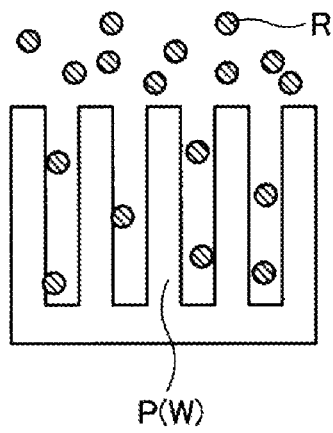

After the IPA is removed from the concave portions, the pressure inside the processing container 301 is lowered to the atmospheric pressure, so that as illustrated in FIG. 5D, the state of the processing fluid R is changed from the supercritical state into the gas state, and the concave portions are occupied by only the gas. In this way, the IPA within the concave portions of the pattern P is removed, and the drying processing of the wafer W is completed.

Next, the drying method (the substrate processing method) performed using the supercritical processing apparatus 3 will be described. The drying method described hereinbelow is automatically performed under the control by the controller 4 based on a processing recipe and a control program that are stored in the storage unit 19.

<Carry-in Process>

The wafer W that has been subjected to the cleaning processing in the cleaning apparatus 2 is carried out from the cleaning apparatus 2 by the second conveyance mechanism 161, in a state where the concave portions of the pattern on the surface of the wafer W are filled with the IPA, and paddles of the IPA are formed on the surface of the wafer W. The second conveyance mechanism 161 places the wafer on the holding plate 316. Then, the holding plate 316 on which the wafer is placed enters the container body 311, and the lid member 315 is fitted with the container body 311 in the sealing manner. In this way, the carry-in of the wafer is completed.

Figure 6:
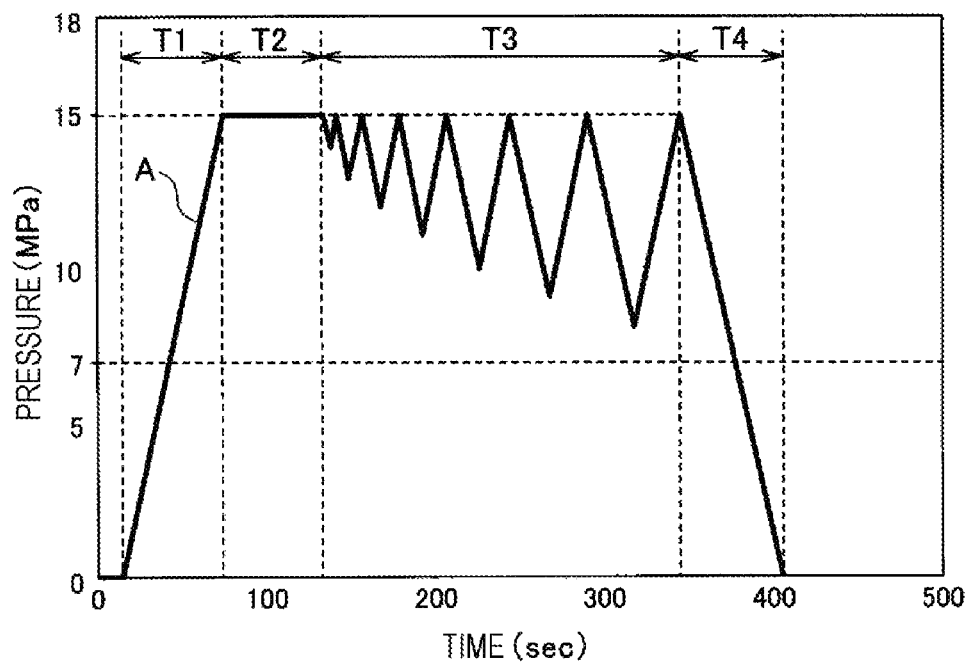
FIG. 6 is a graph representing a fluctuation of a pressure inside the processing container during a drying processing.

Next, the processing fluid ($CO_2$) is supplied into the processing container 301 according to the procedure illustrated in the time chart of FIG. 6, and the drying processing of the wafer W is performed. In FIG. 6, the curved line A indicates the relationship between the time elapsing from the start of the drying processing and the pressure inside the processing container 301.

<Pressure Increasing Process>

Next, as the processing container 301 is filled with $CO_2$ (carbon dioxide) which is the processing fluid, the pressure inside the processing container 301 is increased from a pressure lower than a critical pressure of the processing fluid (specifically, the normal (atmospheric) pressure) to a processing pressure higher than the critical pressure. Specifically, before starting the supply of $CO_2$ into the processing container 301, the initial set pressure of the back pressure valve 59 is set to zero (equal to the atmospheric pressure) or a value slightly higher than zero as a gauge pressure, the opening/closing valves 52a, 52f, and 52g are brought into an opened state, and the opening/closing valves 52b, 52c, 52d, 52e, 52h, 52i, and 52j are brought into a closed state. Further, the needle valves 61a and 61b are regulated to a predetermined opening degree.

In this state, the pressure increasing process is started by opening the opening/closing valve 52c. When the opening/closing valve 52c is opened, $CO_2$ in the supercritical state that is fed from the fluid supply tank 51 with a pressure of about 16 MPa is ejected from the fluid supply nozzle 341 disposed directly under the central portion of the wafer W toward the lower surface of the holding plate 316.

$CO_2$ ejected from the fluid supply nozzle 341 (see arrow F1 in FIG. 3) collides with the holding plate 316 covering the lower surface of the wafer W, and then, spreads radially along the lower surface of the holding plate 316 (see arrow F2 in FIG. 3). Thereafter, $CO_2$ flows into the space on the side of the upper surface of the wafer W through the gap between the edge of the holding plate 316 and the side wall of the container body 311 (see arrow F3 in FIG. 3).

When $CO_2$ flows into the processing container 301, the pressure inside the processing container 301 begins to increase from the normal (atmospheric) pressure. When the pressure of the processing container 301 exceeds the set pressure (zero or a pressure slightly higher than zero as a gauge pressure) of the back pressure valve 59, the back pressure valve 59 is opened to an opening degree corresponding to the pressure of the processing container 301. Accordingly, $CO_2$ flows out from the processing container 301 through the fluid discharge header 318. The set pressure of the back pressure valve 59 is gradually increased with elapse of time, so as to become a processing pressure to be described later at the time when the pressure increasing process T1 is ended. In addition, the set pressure of the back pressure valve 59 is changed such that the flow rate of $CO_2$ discharged from the processing container 301 becomes, for example, about 10% to 20% of the flow rate of $CO_2$ supplied into the processing container 301. In order to implement this change, an appropriate temporal change in the set pressure of the back pressure valve 59 may be obtained in advance through, for example, experiments, and on this basis, the set pressure of the back pressure valve 59 may be changed. In the pressure increasing process T1, the back pressure valve 59 is substantially used as a flow rate control valve.

By changing the set pressure of the back pressure valve 59As as described above, $CO_2$ is supplied into the processing container 301 through the fluid supply nozzle 341 while flowing out from the processing container 301 through the fluid discharge header 318 at a relatively small flow rate. As a result, the pressure inside the processing container 301 is gradually increased. Thus, the flow of $CO_2$ from the fluid supply nozzle 341 toward the fluid discharge header 318 is formed in the processing container 301.

At the initial stage of the pressure increasing process T1, especially, immediately after the start of the supply of $CO_2$ into the processing container 301, particles attached to the surfaces of members facing the internal space of the processing container 301 such as, for example, the inner wall surface of the processing container 301 and the surface of the holding plate 316 tend to travel upward. The particles are carried along with the flow of $CO_2$ inside the processing container 301 and discharged from the processing container 301 through the fluid supply header 317.

At the initial stage of the pressure increasing process T1, the pressure of $CO_2$ fed in the supercritical state from the fluid supply tank 51 is decreased when passing through the orifice 55a, and also decreased when flowing into the processing container 301 in the normal pressure state. Thus, at the initial stage of the pressure increasing process T1, the pressure of $CO_2$ flowing into the processing container 301 is lower than the critical pressure (e.g., about 7 MPa), that is, $CO_2$ flows into the processing container 301 in the gas state. Thereafter, the pressure inside the processing container 301 is increased as the filling of the processing container 301 with $CO_2$ is progressed. When the pressure inside the processing container 301 exceeds the critical pressure, $CO_2$ existing inside the processing container 301 becomes the supercritical state.

Figure 7:
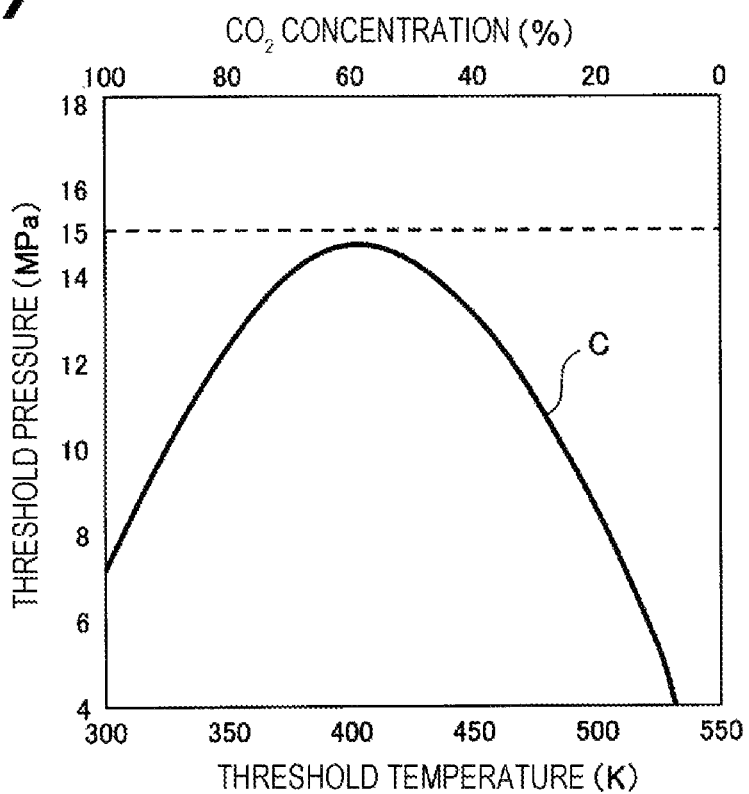
FIG. 7 is a graph representing a relationship of a critical temperature and a critical pressure with respect to a $CO_2$ concentration in a mixed fluid composed of IPA and $CO_2$.

In the pressure increasing process T1, when the pressure inside the processing container 301 is increased and exceeds the critical pressure, the processing fluid inside the processing container 301 becomes the supercritical state, and the IPA on the wafer W begins to be dissolved in the processing fluid in the supercritical state. Then, the mixture ratio of the IPA and $CO_2$ in the mixed fluid composed of $CO_2$ and the IPA is changed. In addition, the mixture ratio may not be uniform throughout the entire surface of the wafer W. In order to suppress a pattern collapse caused from an unexpected evaporation of the mixed fluid, in the pressure increasing process T1, the pressure inside the processing container 301 is increased to a pressure ensuring that $CO_2$ inside the processing container 301 becomes the supercritical state, irrespective of the $CO_2$ concentration in the mixed fluid, e.g., 15 MPa in this case. Here, the "pressure ensuring that $CO_2$ becomes the supercritical state" refers to a pressure higher than the peak value of the pressure indicated by the curve C in the graph of FIG. 7. This pressure (15 MPa) is called a "processing pressure."

<Holding Process>

When the pressure inside the processing container 301 is increased to the processing pressure (15 MPa) by the pressure increasing process T1, the process shifts to a holding process T2 for holding the pressure inside the processing container 301 by closing the opening/closing valves 52b and 52f positioned on the upstream side and the downstream side of the processing container 301, respectively. This holding process is continued until the IPA concentration and the $CO_2$ concentration in the mixed fluid present within the concave portions of the pattern P of the wafer W become predetermined concentrations (e.g., the IPA concentration becomes equal to or less than 30%, and the $CO_2$ concentration becomes equal to or more than 70%). The time for the holding process T2 may be determined by experiments. In the holding process T2, the opening/closing state of the other valves is the same as the opening/closing state in the pressure increasing process T1.

<Circulating Process>

A circulating process T3 is performed after the holding process T2. The circulating process T3 may be performed by alternately repeating a pressure decreasing step of decreasing the pressure inside the processing container 301 by discharging the mixed fluid of $CO_2$ and the IPA from the inside of the processing container 301, and a pressure increasing step of increasing the pressure inside the processing container 301 by supplying new $CO_2$ containing no IPA into the processing container 301 from the fluid supply tank 51.

The circulating process T3 is performed by bringing the opening/closing valves 52b and 52f into an opened state to repeatedly increase and decrease the set pressure of the back pressure valve 59. Alternatively, the circulating process T3 may be performed by repeating the opening and the closing of the opening/closing valve 52f in a state where the opening/closing valve 52b is opened, and the set pressure of the back pressure valve 59 is set to a low value.

In the circulating process T3, $CO_2$ is supplied into the processing container 301 using the fluid supply header 317 (see arrow F4 in FIG. 3). The fluid supply header 317 may supply $CO_2$ at a larger flow rate than that in the fluid supply nozzle 341. In the circulating process T3, since the pressure inside the process container 301 is held at a pressure sufficiently higher than the critical pressure, there is no problem in performing the drying even when $CO_2$ at a large flow rate collides with the surface of the wafer W or flows near the surface of the wafer W. Thus, in view of reduction of the processing time, the fluid supply header 317 is used.

In the pressure increasing step, the pressure inside the processing container 301 is increased to the processing pressure (15 MPa). In the pressure decreasing step, the pressure inside the processing container 301 is decreased from the processing pressure to a predetermined pressure (a pressure higher than the critical pressure). In the pressure decreasing step, since the processing fluid is supplied into the processing container 301 through the fluid supply header 317, and simultaneously, the processing fluid is discharged from the processing container 301 through the fluid discharge header 318, a laminar flow of the processing fluid flowing substantially in parallel with the surface of the wafer W is formed inside the processing container 301 (see arrow F6 in FIG. 3).

The replacement of the IPA with $CO_2$ within the concave portions of the pattern of the wafer W is promoted by performing the circulating process. Since the critical pressure of the mixed fluid is decreased as illustrated in the left side of FIG. 7 as the replacement of the IPA with $CO_2$ within the concave portions is progressed, the pressure inside the processing container 301 at the time when each pressure decreasing step is ended may be gradually lowered while meeting the condition that the pressure inside the processing container 301 is higher than the critical pressure of the mixed fluid corresponding to the $CO_2$ concentration in the mixed fluid.

<Discharging Process>

When the replacement of the IPA with $CO_2$ within the concave portions of the pattern is completed with the circulating process T3, a discharging process T4 is performed. The discharging process T4 may be performed by bringing the opening/closing valves 52a, 52b, 52c, 52d, and 52e into a closed state, setting the set pressure of the back pressure valve 59 to the normal pressure, bringing the opening/closing valves 52f, 52g, 52h, and 52i into an opened state, and bringing the opening/closing valve 52j into a closed state. When the pressure inside the processing container 301 becomes lower than the critical pressure of $CO_2$ by the circulating process T4, $CO_2$ in the supercritical state is evaporated and leaves the inside of the concave portions of the pattern. Accordingly, the drying processing of one wafer W is ended.

The effects of the above-described exemplary embodiment will be described hereinbelow. As described above, when $CO_2$ is supplied into the processing container 301, particles attached to the surfaces of the members inside the processing container 301 are separated and travel upward inside the processing container 301. Especially, immediately after the start of the pressure increasing process, many particles travel upward since the pressure inside the processing container 301 is low, and the inflow velocity of $CO_2$ is high. In the pressure increasing process of a related art method, the discharge of $CO_2$ from the processing container 301 is not performed. Thus, as the pressure of the processing container 301 is increased, the flow rate of $CO_2$ ejected from the fluid supply nozzle 341 is gradually decreased and eventually becomes substantially zero. Then, the upwardly traveling particles fall and are attached to the surface of the wafer W.

Figure 8:
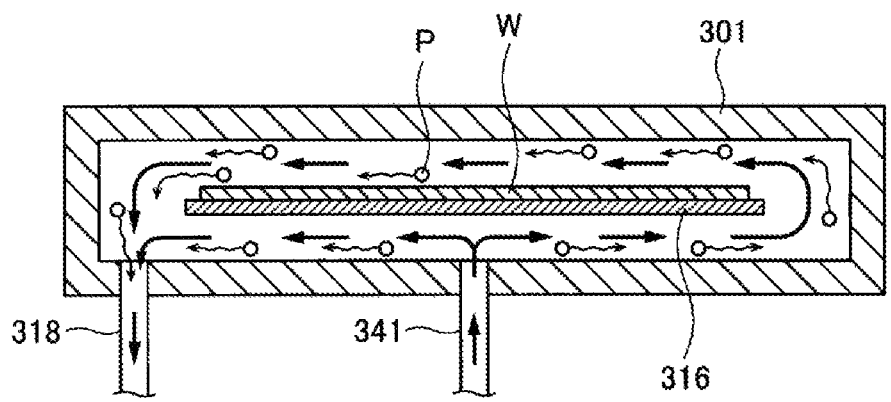
FIG. 8 is a schematic view for explaining upward traveling and discharge of particles.

Meanwhile, in the pressure increasing process T1 of the above-described exemplary embodiment, $CO_2$ is supplied into the processing container 301 from the fluid supply nozzle 341, and simultaneously, $CO_2$ is discharged from the processing container 301 through the fluid discharge header 318. Thus, the flow of $CO_2$ directed from the fluid supply nozzle 341 toward the fluid discharge header 318 is formed (see thick arrows in FIG. 8). As a result, the particles traveling upward by the supply of $CO_2$ into the processing container 301 from the fluid supply nozzle 341 (indicated by blank circles marked with symbol "P" in FIG. 8) are carried along with the flow of $CO_2$ formed inside the processing container 301 and discharged from the processing container 301. Thus, the upwardly traveling particles are suppressed from being attached to the wafer W or largely reduced.

From the viewpoint of suppressing particles from being attached to the wafer W, $CO_2$ may be continuously discharged from the processing container 301 through the fluid discharge header 318 during the entire time from the start to the end of the pressure increasing process T1. The continuous discharge is performed in the above-described exemplary embodiment. Meanwhile, when $CO_2$ is discharged, time required to increase the pressure becomes long. Immediately after the start of the pressure increasing process T1, the upward traveling of particles is the most severe since the flow velocity of $CO_2$ ejected from the fluid supply nozzle 341 is high. Thereafter, new upwardly traveling particles are reduced as time elapses. Thus, the amount of the particles discharged from the processing container 301 is also high in the first half of the pressure increasing process T1, and is reduced in the second half thereof. In consideration of this point, the discharge of $CO_2$ may be stopped during the pressure increasing process T1. Alternatively, the discharge flow rate of $CO_2$ may be lowered during the pressure increasing process T1. For example, the flow rate of $CO_2$ discharged from the processing container 301 may be lowered to 20% of the flow rate of $CO_2$ supplied into the processing container 301 in the first half of the pressure increasing process, and 10% in the second half thereof. Instead of performing the discharge of $CO_2$ from the start of the pressure increasing process T1, the discharge of $CO_2$ may be started after a little time elapses from the start of the pressure increasing process T1, and a certain amount of particles travel upward.

In the above-described exemplary embodiment, in the pressure increasing process T1, the supply of $CO_2$ into the processing container 301 is performed by only the fluid supply nozzle 341. This is very effective in suppressing the upward traveling of particles. However, the present disclosure is not limited thereto, and the supply of $CO_2$ into the processing container 301 in the second half of the pressure increasing process T1 (at this time, since the pressure of the processing container 301 is increased, the supply flow rate of $CO_2$ becomes relatively low) may be performed by the fluid supply header 317 or may be performed by both the fluid supply nozzle 341 and the fluid supply header 317.

In the substrate processing apparatus of related art in which the supply of $CO_2$ into the processing container 301 during the pressure increasing process T1 is performed by only the fluid supply header 317 (that is, $CO_2$ is ejected in the direction parallel with the surface of the wafer W from an ejection member such as, for example, a nozzle provided at one side end portion inside the processing container 301), the operation to supply $CO_2$ into the processing container 301 while discharging $CO_2$ from the processing container 301 is also effective in suppressing particles from being attached to the wafer W.

When the liquid to be removed (the IPA in this case) is removed from the surface of the wafer W before the pressure inside the processing container 301 reaches the critical pressure (about 7 MPa) of the processing fluid ($CO_2$ in this case), a pattern collapse occurs. When the discharge flow rate of $CO_2$ discharged from the processing container 301 through the fluid discharge header 318 is high, the discharge efficiency of particles is improved, but the time to reach the critical pressure becomes long. In this case, the IPA is evaporated before the pressure inside the processing container 301 reaches the critical pressure, and thus, the risk of the occurrence of a pattern collapse increases. The discharge flow rate of $CO_2$ at which no pattern collapse occurs may be confirmed in advance by experiments.

In the above-described exemplary embodiment, the pressure of the processing container 301 is increased while performing the discharge of $CO_2$ from the processing container 301, by changing the set pressure of the back pressure valve 59 of which the set pressure is variable (remotely controllable by the controller 4) with elapse of time. That is, in the above-described exemplary embodiment, the back pressure valve 59 constitutes a discharge flow rate regulating unit that regulates the flow rate of the processing fluid discharged from the processing container 301 to the main discharge line 65. However, the configuration of the discharge flow rate regulating unit for implementing the increasing of the pressure in the above-described aspect is not limited thereto. For example, a bypass line (not illustrated) may be provided in the main discharge line 65 to bypass the back pressure valve 59, and flow rate control valves such as, for example, an opening/closing valve and a needle valve, and a flow meter may be provided on the bypass line. In this case, in the pressure increasing process T1, the set pressure of the back pressure valve 59 is fixed to the processing pressure (16 MPa). Then, the increasing of the pressure may be performed by regulating the opening degree of the flow rate control valves such that a detection value of the flow meter is maintained at a target value (a relatively small flow rate) in a state where the opening/closing valves of the bypass line are opened. In the subsequent processes, the opening/closing valves of the bypass line are closed, and the back pressure valve 59 is controlled as described above.

For example, the processing fluid used for the drying processing may be a fluid other than $CO_2$ (e.g., a fluorine-based fluid), or any fluid capable of removing the drying prevention liquid filled in the substrate in the supercritical state. In addition, the drying prevention liquid is not limited to the IPA and may be any liquid usable as the drying prevention liquid. The substrate to be processed is not limited to the above-described semiconductor wafer W and may be a different substrate such as, for example, an LCD glass substrate or a ceramic substrate.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate processing apparatus for processing a substrate using a processing fluid in a supercritical state, the apparatus comprising:
    a processing container that accommodates the substrate and has a first end and a second end opposite the first end;
    a supply line configured to feed the processing fluid in the supercritical state from a fluid supply source to the processing container through at least one nozzle;
    a discharge line that discharges the processing fluid from the processing container through a discharge port positioned at the first end of the processing container;
    a discharge flow rate regulator that regulates a flow rate of the processing fluid discharged from the processing container to the discharge line; and a controller that controls an operation of the discharge flow rate regulator, wherein during at least part of a time period for increasing a pressure inside the processing container from a pressure lower than a critical pressure of the processing fluid to a pressure higher than the critical pressure, the controller controls the discharge flow rate regulator such that the increasing is performed by supplying the processing fluid into the processing container from the fluid supply source through the supply line while simultaneously discharging the processing fluid from the processing container to the discharge line at a discharge flow rate.

2. The substrate processing apparatus of claim 1, wherein during an entire time period for the increasing, the controller controls the discharge flow rate regulator such that the increasing is performed by supplying the processing fluid into the processing container from the fluid supply source through the supply line while discharging the processing fluid from the processing container to the discharge line at the discharge flow rate.

3. The substrate processing apparatus of claim 1, wherein the controller changes the discharge flow rate to be different in a first time period of the increasing than in a second time period for the increasing after the first time period.

4. The substrate processing apparatus of claim 3, wherein the discharge flow rate in the first time period is larger than the discharge flow rate in the second time period.

5. A substrate processing method for processing a substrate using a processing fluid in a supercritical state, the method comprising:

causing the substrate to be accommodated in a processing container;

increasing a pressure inside the processing container from a pressure lower than a critical pressure of the processing fluid to a pressure higher than the critical pressure; and holding the pressure inside the processing container at the pressure higher than the critical pressure of the processing fluid after the increasing, wherein during at least part of a time period for the increasing, the processing fluid is supplied into the processing container from a fluid supply source while the processing fluid is discharged simultaneously from the processing container at a discharge flow rate and the discharge flow rate is changed to be different in a first time period for the increasing than a second time period for the increasing after the first time period.

6. The substrate processing method of claim 5, wherein during an entire time period for the increasing, the processing fluid is supplied into the processing container from a fluid supply source while the processing fluid is discharged simultaneously from the processing container at the discharge flow rate.

7. The substrate processing method of claim 5, wherein the discharge flow rate in the first time period is larger than the discharge flow rate in the second time period.

8. A non-transitory computer-readable storage medium storing a program that, when executed by a computer that controls an operation of a substrate processing apparatus, causes the computer to control the operation of the substrate processing apparatus and execute the substrate processing method of claim 5.

9. The substrate processing apparatus of claim 1, wherein the at least one nozzle includes a first nozzle positioned at the second end of the processing container and a second nozzle facing a bottom of the substrate holder.

10. The substrate processing method of claim 5, further comprising:

alternately repeating a decreasing of pressure inside the processing container by discharging the processing fluid from inside the processing chamber, and an increasing of pressure inside the processing container by supplying the processing fluid into the processing container, after the holding, wherein the pressure within the chamber remains higher than the critical pressure of the processing fluid during the alternately repeating.

* * * * *